US005886656A

United States Patent [19]

Feste et al.

[11] Patent Number: 5,886,656

[45] Date of Patent: Mar. 23, 1999

[54] DIGITAL MICROPHONE DEVICE

[75] Inventors: Sandro Dalle Feste, Novara; Marco Bianchessi, Sergnano; Nadia Serina, Castelcovati, all of Italy

[73] Assignee: SGS-Thomson Microelectronics, S.r.l., Agrate Brianza, Italy

[21] Appl. No.: 653,427

[22] Filed: May 24, 1996

[30] Foreign Application Priority Data

Sep. 29, 1995 [EP] European Pat. Off. .............. 95830403

[51] Int. Cl.[6] .............. H03M 3/02

[52] U.S. Cl. .............. 341/143; 341/155

[58] Field of Search .............. 341/143, 155

[56] References Cited

U.S. PATENT DOCUMENTS

| | | | |
|---|---|---|---|
| 4,422,182 | 12/1983 | Kenjyo | 455/614 |
| 4,548,082 | 10/1985 | Engebretson et al. | 73/585 |
| 4,831,380 | 5/1989 | Gimblett | 341/166 |
| 4,882,773 | 11/1989 | Maloney | 455/617 |
| 4,905,255 | 2/1990 | Aalaei | 375/17 |
| 5,103,229 | 4/1992 | Ribner | 341/143 |
| 5,148,166 | 9/1992 | Ribner | 341/143 |
| 5,298,900 | 3/1994 | Mauthe et al. | 341/143 |
| 5,303,307 | 4/1994 | Elko et al. | 381/92 |
| 5,465,270 | 11/1995 | Beauducel et al. | 375/242 |
| 5,473,701 | 12/1995 | Cezanne et al. | 381/92 |
| 5,475,731 | 12/1995 | Rasmusson et al. | 379/3 |
| 5,590,241 | 12/1996 | Park et al. | 395/2.36 |
| 5,657,384 | 8/1997 | Staudacher et al. | 379/388 |

FOREIGN PATENT DOCUMENTS

| | | |
|---|---|---|
| 39 35 308 C1 | 1/1991 | Germany . |
| WO 95/19085 | 7/1995 | WIPO . |

*Primary Examiner*—Marc S. Hoff
*Attorney, Agent, or Firm*—David V. Carlson; Frederick M. Fliegel; Seed and Berry LLP

[57] ABSTRACT

A microphone device having input terminals for receiving an input analog signal and output terminals to produce an output digital signal. The microphone device includes a converter circuit having input terminals coupled to the input terminals of the microphone device and an output terminal coupled to the output terminals of the microphone and an output terminal coupled to the output terminals of the microphone device. The device includes an analog input interface having input terminals corresponding to the input terminals of the microphone device and first and second output terminals to produce an amplified analog voltage signal, a converter circuit having first and second input terminals corresponding respectively to the first and the second output terminals of the analog input interface and an output terminal to produce a digital voltage signal and a parallel to serial digital output interface having an input terminal corresponding to the output terminal of the converter circuit and output terminals corresponding to the output terminals of the microphone device. The converter circuit desirably includes a signal modulator circuit having an input terminal coupled to the input terminals of the converter circuit and an output terminal to produce an intermediate digital voltage signal and a signal sampler circuit having an input terminal corresponding to the output terminal of the signal modulator circuit and an output terminal corresponding to the output terminal of the converter circuit.

18 Claims, 4 Drawing Sheets

DIGITAL MICROPHONE DEVICE

BACKGROUND OF THE INVENTION

1. Field of the Invention

This invention relates to devices for processing audio signals, and in particular to a digital microphone device.

2. Description of the Related Art

In recent years, the processing of audio signals has had considerable improvement. More specifically, the ability to integrate digital functions by VLSI-type technologies has made it possible to translate many analog functions into a digital format. It is currently possible to reproduce in a digital format effects that, in the past, could only be achieved in an analog format as equalizations which include filtering in general, surround effects, reverberations, and echoes. These effects have a better quality than in the past, when obtained in a digital format.

In addition, new and more advanced sub-micrometer manufacturing processes have resulted in smaller and more powerful digital integrated circuits which have a low cost. Consequently, conversion devices to convert analog signals to digital signals and vice versa, have obtained a great importance.

The trend toward a digital domain in the processing of audio signals is so marked that even signal sources, understood as reproduction devices, are now implemented join a digital format. Consequently, in systems for transmitting audio signals, microphone devices will soon be the only devices to be performed in an analog format.

Generally, the analog microphone devices include a transducer circuit to produce a voltage analog signal which is proportional to an audio signal generated by a sound source. In some microphone devices, this voltage analog signal is amplified before being transmitted over a cable or broadcast. In the case in which the voltage analog signal is broadcast, e.g. in cordless applications, it would have to be frequency-modulated before its transmission using carrier frequencies in the 170 MHz range.

The analog microphone devices, while being advantageous in many ways, still have some drawbacks such as coupling noise due to electromagnetic waves that surround the devices, attenuations, and filtering due to the transmitting means. Generally, these drawbacks decrease the quality of the transmitted signal.

SUMMARY OF THE INVENTION

A principal object of the present invention is the provision of a digital microphone device which has a high quality transmitted signal and a low manufacturing cost.

The preferred embodiment of the invention is implemented in a digital microphone device for use in an audio signals transmission system. The microphone device has input terminals for receiving an input analog voltage signal generated by a transducer circuit connected to an audio signal source, and output terminals to produce an output digital voltage signal which is transmitted to a user apparatus. The digital microphone device includes an analog input interface having input terminals corresponding to the input terminals of the microphone device and first and second output terminals to produce an amplified analog voltage signal. The microphone device also comprises a converter circuit having first and second input terminals corresponding respectively to the first and the second output terminals of the analog input interface. The converter circuit also has an output terminal to produce a digital voltage signal arranged in a parallel format. Finally the microphone device includes a parallel-serial digital output interface having an input terminal corresponding to the output terminal of the converter circuit and output terminals corresponding to the output terminals of the microphone device, wherein the digital output interface produces the output digital voltage signal arranged in a serial format.

The features and advantages of the device according to the present invention will become apparent from the following description of an embodiment thereof, given by way of example and not limitation, with reference to the accompanying drawings.

DETAILED DESCRIPTION OF THE PREFERRED EMBODIMENT

The figures of the accompanying drawings generally and schematically illustrate a device in accordance with the invention.

Figure 1:
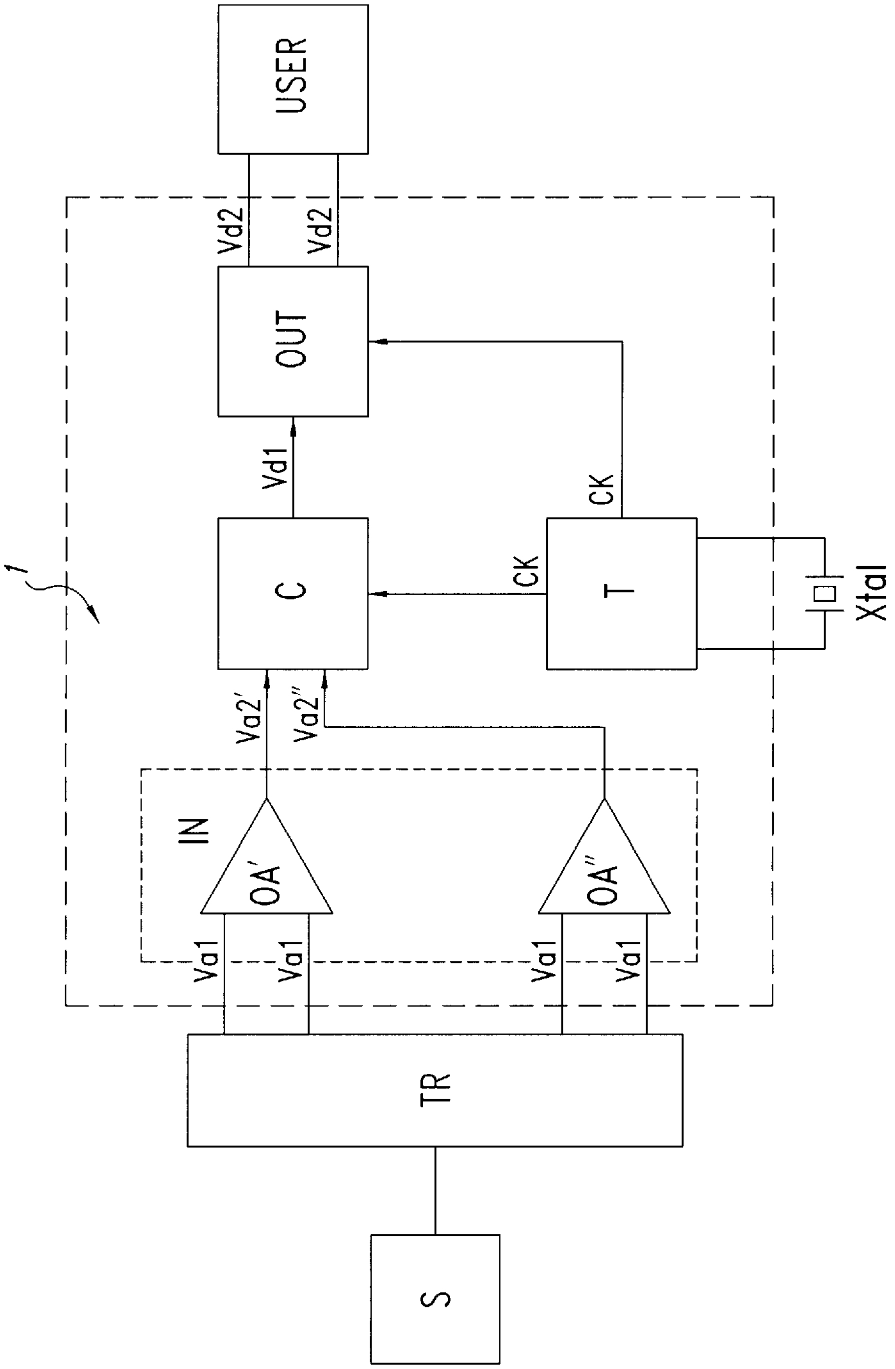
FIG. 1 is a simplified diagram of a device constructed according to the invention.

With particular reference to FIG. 1, a preferred embodiment of the inventive circuit is designated generally by reference number 1. The device 1 includes an analog input interface IN having first, second, third and fourth input terminals for receiving an analog voltage signal designated Va1. The analog voltage signal Va1 is generated by a transducer circuit TR and it is proportional to an audio signal produced by a signal source S. The analog input interface IN also has first and second output terminals to produce an analog voltage signal designated Va2. The input interface IN includes first OA' and second OA" amplifier circuits. More specifically, the first amplifier circuit OA' has first and second input terminals corresponding to the first and the second input terminals of the input interface IN and an output terminal corresponding to the first output terminal of the input interface IN. The second amplifier circuit OA" has first and second input terminals corresponding to the third and the fourth input terminals of the input interface IN and an output terminal corresponding to the second output terminal of the input interface IN. In addition, each amplifier circuit comprises a circuit portion, not shown in FIG. 1, having an automatic gain control (AGC).

The device 1 also includes a timer circuit T connected to a quartz element Xtal and having output bus to produce a clock signal designated CK. The device 1 further comprises an analog-to-digital converter circuit C having first and second input terminals for receiving the analog voltage signal Va2, a third input terminal for receiving the clock signal CK and an output terminal to produce a digital voltage signal Vd1. Specifically, the first input terminal of the converter circuit C is connected to the output terminal of the amplifier circuit OA', the second input terminal of the converter circuit C is connected to the output terminal of the amplifier circuit OA", and the third input terminal of the converter circuit C is connected to the first output terminal of the timer circuit T.

The device 1 also includes a parallel to serial digital output interface OUT which has a first input terminal for receiving the digital signal voltage Vd1, a second input terminal for receiving the clock signal CK and first and second output terminals to produce a digital voltage signal designated Vd2. This digital voltage signal Vd2 is then transmitted to a user apparatus designated USER. In particular, the the input bus of the output interface OUT is coupled to the output bus of the converter circuit C and to the second output terminal of the timer circuit T. The first and the second output terminals of the output circuit OUT correspond to output terminals of the microphone device 1.

Figure 2:
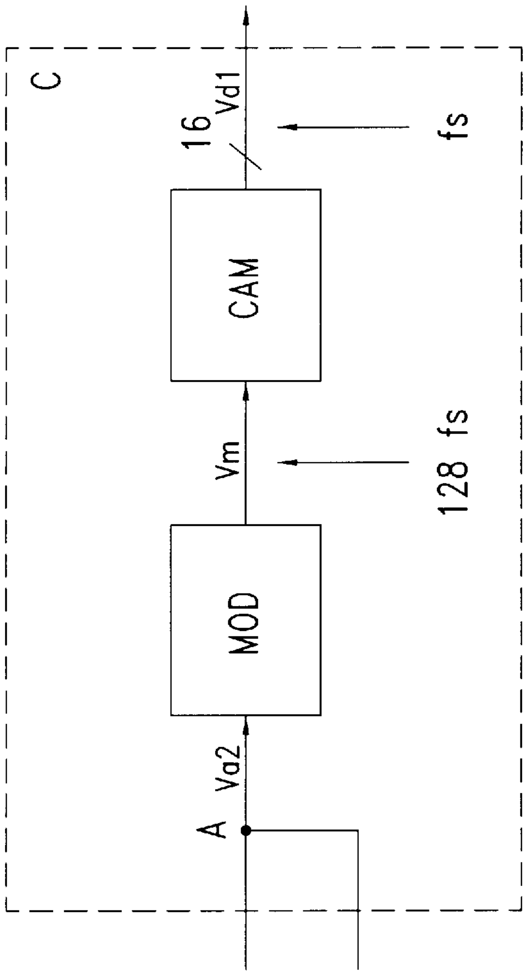
FIG. 2 is a simplified diagram of a detail of the diagram illustrated in FIG. 1.

With reference to FIG. 2 the converter circuit C comprises a signal modulator circuit MOD, constructed for example using a Sigma-Delta type structure, having an input terminal for receiving the analog voltage signal Va1 and an output terminal to produce a digital voltage signal designated Vm. Specifically, the input terminal of the modulator circuit MOD is coupled to the the first and the second input terminals of the converter circuit C through a node A. The signal modulator circuit MOD is connected in cascade to a signal sampler circuit CAM having an input terminal connected to the output terminal of the signal modulator circuit MOD and an output terminal corresponding to the output terminal of the converter circuit C. It is noted that the converter circuit is fabricated to high quality standards, e.g. with a signal to noise ratio better than 90 dB, and at low cost for example using the Sigma-Delta techniques with a low power consumption.

Figure 3:
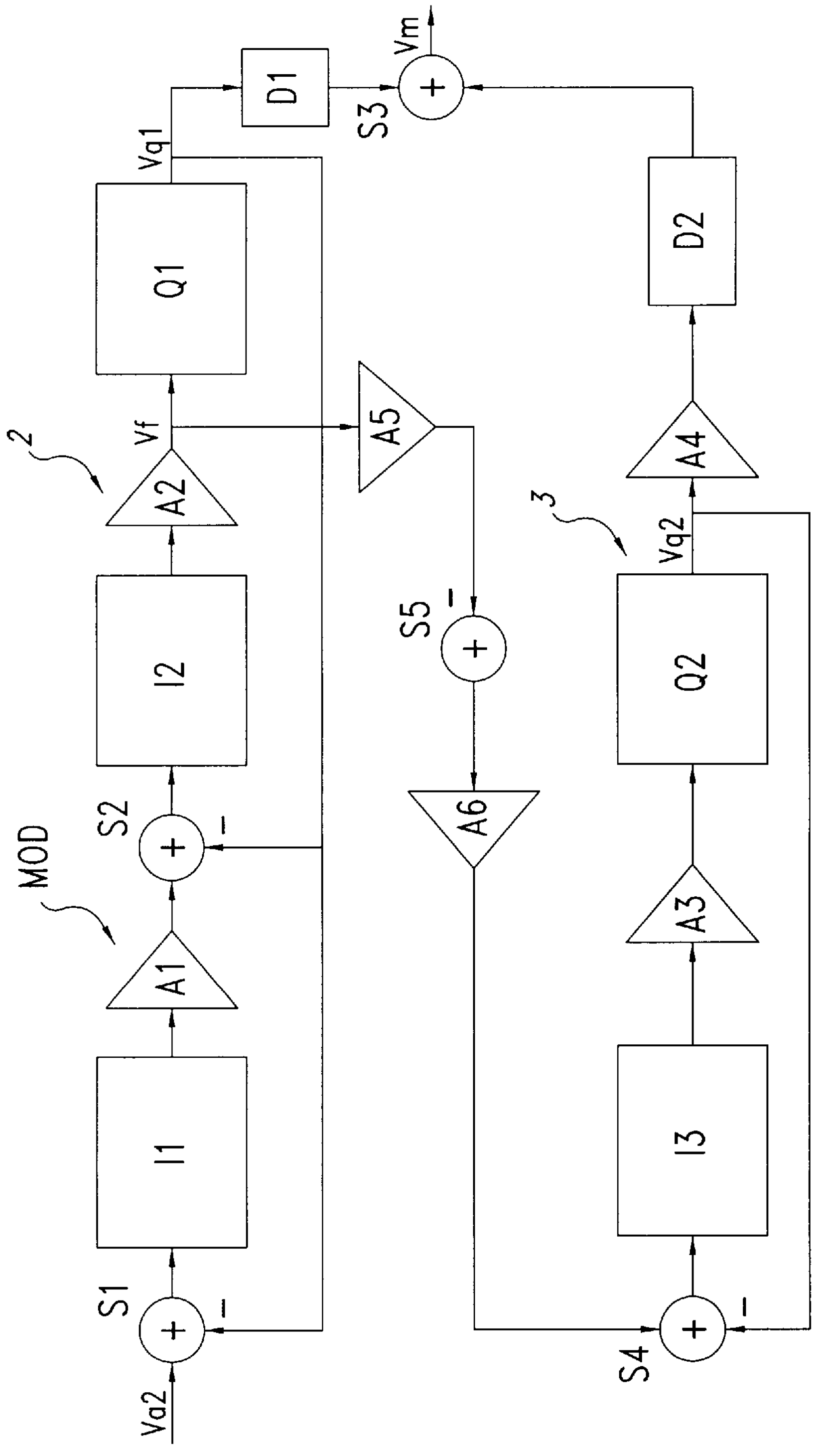
FIG. 3 is a simplified diagram of a detail of the diagram illustrated in FIG. 2.

Referring now to FIG. 3, the signal modulator circuit MOD includes first (2) and second (3) circuit portions. More particularly, the first circuit portion 2 of the signal modulator circuit MOD has an input terminal coupled to the input terminal of the signal modulator circuit MOD through a summing node S1, and an output terminal to produce a digital voltage signal designated Vq1. The output terminal of the first circuit portion 2 is coupled to the output terminal of the signal modulator circuit MOD through a derivation circuit D1 connected in cascade with a summing node S3. The first circuit portion 2 includes an integrator circuit I1, an amplifier circuit Al, a summing node S2, an integrator circuit I2, an amplifier circuit A2, and a quantizer circuit Q1, all connected in cascade together. More specifically, the quantizer circuit Q1 has an input terminal for receiving a voltage signal designated Vf and an output terminal corresponding to the output terminal of the first circuit portion 2. The quantizer noise Q1 is feedback coupled to the integrator circuit I1 through the summing node S1 and it is also feedback coupled to the integrator circuit I2 through the summing node S2.

The second circuit portion 3 of the signal modulator circuit MOD has an input terminal coupled to the input terminal of the quantizer circuit Q1 through an amplifier circuit A5, a summing node S5, an amplifier circuit A6 and a summing node S4, all connected in cascade together. The input terminal of the second circuit portion 3 is also coupled to the output terminal of the quantizer circuit Q1 through the summing node S5, the amplifier circuit A6 and the summing node S4. The second circuit portion 3 also has an output terminal to produce a digital voltage signal designated Vq2. The output terminal of the second circuit portion 3 is coupled to the output terminal of the signal modulator circuit MOD through an amplifier circuit A4, a derivation circuit D2 and the summing node S3, all connected in cascade together. Specifically, the second circuit portion 3 includes an integrator circuit I3, an amplifier circuit A3 and a quantizer circuit Q2, all connected in cascade together. The quantizer circuit Q2 is feedback coupled to the integrator circuit I3 through the summing node S4.

Figure 4:
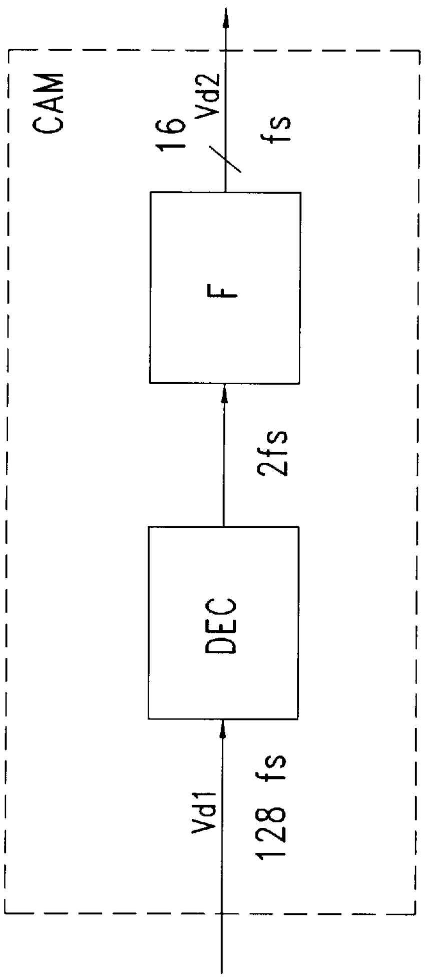
FIG. 4 is a simplified diagram of a further detail of the diagram illustrated in FIG. 2.

As shown in FIG. 4, the signal sampler circuit CAM includes a clipping circuit DEC having an input terminal corresponding to the input terminal of the signal sampler circuit CAM, and an output terminal. The clipping circuit DEC is connected in cascade to a filter F, constructed for example using a FIR-type structure, having an input terminal connected to the output terminal of the decimation circuit DEC and an output terminal corresponding to the output terminal of the signal sample circuit CAM.

The operation of the microphone device 1 will now be described with particular reference to an initial state in which the transducer TR has generated the analog voltage signal Va1. The analog voltage signal Va1 is amplified through the first OA' and the second OA" amplifier circuits, each having an high input impedance, to produce the analog voltage signal Va2. The circuit portions which have an automatic gain control adapt the amplification produced by the amplifier circuits to the current sound level.

The analog voltage signal Va2 is then converted by the modulator circuit MOD to the digital voltage signal Vm which is arranged into a string of bits. The digital voltage signal Vm contains, at low frequencies, the information included in the analog voltage signal Va2, and at high frequencies, the quantization noise which has been generated during the analog to digital conversion provided at a high speed by the modulator circuit MOD. In addition, the analog voltage signal Va2 is sampled at the rate of 128 fs, where fs is the speed of the digital signal Vd2. Specifically, the first circuit portion 2 of the modulator circuit MOD carries out, on the analog voltage signal Va2, a second order integration followed by a quantization at two levels. Consequently, the digital voltage signal Vq1 is equal to:

$$Vq1(z)=Va2(z)+Q1(z)*(1-z^{-1})^2$$

where $Q1(z)*(1-z^{-1})^2$ is the quantization noise introduced by the quantizer circuit Q1 and suitably filtered.

The second circuit portion 3 of the modulator circuit MOD processes the difference between the signals Vf and Vq1 respectively present at the input and at the output of the quantizer circuit Q1. The integration with feedback provided by this second circuit portion 3 plus the provision of the quantizer block Q2 produces the digital voltage signal Vq2 which is equal to:

$$Vq2(z)=Q1(z)+Q2(z)*(1-z^{-1})^2$$

where $Q2(z)*(1-z^{-1})^2$ is the quantization noise introduced by the second quantizer block Q2 and suitably filtered. The digital voltage signals Vq1 and Vq2 are then suitably summed to produce the digital voltage signal Vm which is equal to:

$$Vm(z)=Va2(z)+Q2(z)*(1-z^{-1})^3$$

where the quantizer noise generated by the quantizer block Q1 is fully suppressed and the quantizer noise introduced by the quantizer block Q2 is suitably filtered. Consequently, the digital voltage signal Vm is a clean base-band signal as the quantizer noise is concentrated at high frequencies. It is noted that this type of Sigma-Delta modulator circuit is known as “third order Mash”.

The signal sampler circuit CAM operates to sub-sample, through the decimation circuit DEC, the digital voltage signal Vm to reduce it to correct resolution (e.g., 16 bits for a signal of the audio type). In addition, the signal sampler circuit CAM suppresses, through the filter F, the quantization noise present in the digital voltage signal Vm to produce the digital voltage signal Vd1 which has high quality.

Finally, the output interface OUT is operative to convert into a serial format the digital voltage signal Vd1 and to generate the digital voltage signal Vd2 thereby speeding up the communication with the user apparatus. In addition to transmitting the digital voltage signal Vd2 without deteriorating its quality, the first output terminal of the output interface OUT is a simple-single-pole cable and the second output terminal is a ground return terminal. Transmission standards have been established for transmitting the digital voltage signal Vd2 without deteriorating its quality, such as the AES-EBU standard. The AES-EBU standard allows the digital voltage signal Vd2 to be transmitted over a single electric or optical lead. Where the microphone device is used without cable connections, a digital channel modulation system could be utilized to broadcast the signal. The signal transmission could also be effected in the infrared range using LEDs.

In conclusion, the microphone device of the present invention allows a digital transmission from the microphone device to the reproduction apparatus, with the advantage that all the problems which typically associate with the analog transmission, such as disturbance of the transmissive mean (screen-offs, cable attenuations, RF noise) can now be obviated. In addition, the signal transmission format (AES-EBU in this case) enables errors to be corrected, conferring superior quality features on the microphone device for the same cost. Not least in importance is the fact that by having the signal conversion and the transmission apparatus integrated to the same chip, the manufacturing costs of the microphone device can be lowered.

What is claimed is:

1. A microphone device comprising:

input terminals for receiving an input analog acoustic signal and output terminals to produce an output digital signal;

a converter circuit having input terminals coupled to the input terminals of the microphone device and an output terminal coupled to the output terminals of the microphone device, the converter circuit operable to convert the input analog acoustic signal into the output digital signal, wherein the converter circuit includes:

a signal modulator circuit having an input terminal coupled to the input terminals of the converter circuit and an output terminal to produce an intermediate digital signal; and a signal decimator circuit having an input terminal corresponding to the output terminal of the signal modulator circuit and an output terminal corresponding to the output terminal of the converter circuit.

2. The device of claim 1, wherein the converter circuit is coupled to the input terminals of the microphone device through an analog input interface to produce an amplified analog signal.

3. The device of claim 1, wherein the converter circuit is coupled to the output terminals of the microphone device through a digital output interface.

4. The device of claim 3, wherein the digital output interface is of parallel to serial type.

5. The device of claim 1, wherein the intermediate digital signal is arranged in a parallel format.

6. The device of claim 1, wherein the output digital signal is arranged in a serial format.

7. A microphone device for use in an audio signal transmission system, said microphone device having input terminals for receiving an input analog voltage signal representative of an audio signal and output terminals to produce an output digital voltage signal which is transmitted to a user apparatus, wherein the microphone device includes:

an analog to digital converter circuit having input terminals coupled to the input terminals of the microphone device and an output terminal coupled to the output terminals of the microphone device, the analog to digital converter circuit operable to convert the input analog acoustic signal into the output digital signal, wherein the converter circuit includes:

a signal modulator circuit having an input terminal coupled to the input terminals of the converter circuit and an output terminal to produce an intermediate digital voltage signal; and a signal decimator circuit having an input terminal corresponding to the output terminal of the signal modulator circuit and an output terminal corresponding to the output terminal of the converter circuit.

8. The device of claim 7, wherein the intermediate digital voltage signal is arranged in a parallel format.

9. A digital microphone device for use in an audio signal transmission system:

input terminals for receiving an input analog voltage signal generated by a transducer circuit coupled to an audio signal source;

output terminals to produce an output digital voltage signal which is transmitted to a user apparatus;

an analog input interface having input terminals corresponding to the input terminals of the microphone device and first and second output terminals to produce an amplified analog voltage signal;

a converter circuit having first and second input terminals corresponding respectively to the first and the second output terminals of the analog input interface and an output terminals to produce a digital voltage signal, the converter circuit includes a sampler oversampling the input signal to realize a high quality digital voltage signal and a filter with a cutoff frequency such that the quantization noise is suppressed; and a parallel to serial digital output interface having an input terminal corresponding to the output terminal of the converter circuit and output terminals corresponding to the output terminals of the microphone device, wherein the converter circuit includes:

a signal modulator circuit having an input terminal coupled to the input terminals of the converter circuit and an output terminal to produce an intermediate digital voltage signal; and a signal decimator circuit having an input terminal corresponding to the output terminal of the signal modulator circuit and an output terminal corresponding to the output terminal of the converter circuit.

10. The device of claim 9, wherein the intermediate digital voltage signal is arranged in a parallel format.

11. The device of claim 10, wherein the intermediate digital voltage signal is proportional to the sum of the amplified analog voltage signal and a quantization noise generated by the signal modulator circuit.

12. The device of claim 9, wherein the digital voltage signal is arranged in a parallel format.

13. A digital microphone device for use in an audio signal transmission system:

input terminals for receiving an input analog voltage signal generated by a transducer circuit coupled to an audio signal source;

output terminals to produce an output digital voltage signal which is transmitted to a user apparatus;

an analog input interface having input terminals corresponding to the input terminals of the microphone device and first and second output terminals to produce an amplified analog voltage signal;

an analog to digital converter circuit having first and second input terminals corresponding respectively to the first and the second output terminals of the analog input interface and an output terminal to produce a digital voltage signal;

a parallel to serial digital output interface having an input terminal corresponding to the output terminal of the converter circuit and output terminals corresponding to the output terminals of the microphone device, wherein the analog to digital converter circuit includes a sampler oversampling the input signal to realize a high quality digital voltage signal and a filter with a cutoff frequency such that the quantization noise is suppressed.

14. The device of claim 9, wherein the output digital voltage signal is arranged in a serial format.

15. A device comprising:

an input;

a delta-sigma modulator coupled to said input, said delta-sigma modulator for oversampling an input signal present at said input;

a decimator coupled to an output of said delta-sigma modulator, said decimator for reducing the frequency of the digital signals representing said input signal;

a filter coupled to an output of said decimator, said filter having a cutoff frequency below a frequency of sampling noise introduced by said delta-sigma modulator; and a parallel to serial converter coupled to an output of said filter to provide an output serial bit stream.

16. A device as claimed in claim 15, wherein said decimator reduces said frequency of said digital signals representing said input signal by a factor of 128.

17. A method comprising:

providing an input audio signal from a transducer;

digitizing said input audio signal via an oversampling delta-sigma modulator to provide a first digital signal having a first frequency;

decimating said first digital signal to provide a second digital signal having a second frequency;

filtering said second digital signal to remove signal artifacts at said first frequency; and converting a parallel digital signal from said filtering step to a serial bit stream.

18. A method as claimed in claim 17, wherein said decimating step includes a step of decimating said first digital signal to provide a second digital signal having a second frequency lower in frequency than said first frequency by a factor of one hundred and twenty eight.

* * * * *